US010614932B2

(12) United States Patent
Jin et al.

(10) Patent No.: US 10,614,932 B2
(45) Date of Patent: Apr. 7, 2020

(54) HIGH TEMPERATURE SUPERCONDUCTING MULTICORE TAPE WIRE, AND MANUFACTURING METHOD THEREOF AND MANUFACTURING DEVICE

(71) Applicant: RIKEN, Saitama (JP)

(72) Inventors: Xinzhe Jin, Hokkaido (JP); Hideaki Maeda, Kanagawa-ken (JP)

(73) Assignee: RIKEN, Saitama (JP)

( * ) Notice: Subject to any disclaimer, the term of this patent is extended or adjusted under 35 U.S.C. 154(b) by 484 days.

(21) Appl. No.: 15/503,234

(22) PCT Filed: Aug. 6, 2015

(86) PCT No.: PCT/JP2015/072393
§ 371 (c)(1),
(2) Date: Feb. 10, 2017

(87) PCT Pub. No.: WO2016/024528
PCT Pub. Date: Feb. 18, 2016

(65) Prior Publication Data
US 2017/0236623 A1 Aug. 17, 2017

(30) Foreign Application Priority Data
Aug. 12, 2014 (JP) .................. 2014-164590

(51) Int. Cl.
*H01B 12/14* (2006.01)
*H01F 6/06* (2006.01)
(Continued)

(52) U.S. Cl.
CPC ............. *H01B 12/14* (2013.01); *H01B 12/06* (2013.01); *H01B 12/10* (2013.01); *H01F 6/06* (2013.01);
(Continued)

(58) Field of Classification Search
CPC ........ H01B 12/14; H01B 12/10; H01B 12/06; H01F 6/06; H01L 39/126; H01L 39/2403;
(Continued)

(56) References Cited

U.S. PATENT DOCUMENTS

| 9,786,415 B2* | 10/2017 | Selvamanickam ... H01L 39/143 |
| 2006/0040830 A1* | 2/2006 | Thieme ................. H01L 39/143 |
| | | 505/231 |
| 2006/0077025 A1* | 4/2006 | Funaki ..................... H01F 6/02 |
| | | 335/216 |

FOREIGN PATENT DOCUMENTS

| JP | 2007-141688 | 6/2007 |
| JP | 2007-524198 | 8/2007 |

(Continued)

OTHER PUBLICATIONS

Machi, T. et al., "Reliable fabrication process for long-length multi-filamentary coated conductors by a laser scribing method for reduction of AC loss," Supercond. Sci. Technol., 26 (2013), 105016, 15 pp.

(Continued)

*Primary Examiner* — Paul A Wartalowicz
(74) *Attorney, Agent, or Firm* — Patent Law Works LLP

(57) ABSTRACT

The method is for manufacturing a high temperature multi-filamentary superconducting tape wire having an oxide superconducting layer formed on a tape-shaped metal substrate with an intermediate layer therebetween and a metal stabilizing layer formed on the oxide superconducting layer, wherein one or more lengthwise slits are formed in the oxide superconducting layer and the intermediate layer and no slits are formed in the metal substrate and the stabilizing layer. The method includes: a step for preparing a high temperature superconducting wire material having an oxide superconducting layer formed on a tape-shape metal substrate with an intermediate layer therebetween and a stabilizing (Continued)

layer formed on the oxide superconducting layer; and a step for applying a load to the high temperature superconducting wire material to form slits. The method enables simple manufacturing of a high temperature superconducting wire material having a finer superconducting layer without sacrificing superconducting performance and mechanical strength.

7 Claims, 12 Drawing Sheets

(51) Int. Cl.
    *H01B 12/06*     (2006.01)
    *H01L 39/14*     (2006.01)
    *H01L 39/24*     (2006.01)
    *H01B 12/10*     (2006.01)
    *H01L 39/12*     (2006.01)

(52) U.S. Cl.
    CPC .......... *H01L 39/126* (2013.01); *H01L 39/143* (2013.01); *H01L 39/2403* (2013.01); *H01L 39/2464* (2013.01); *Y02E 40/642* (2013.01)

(58) Field of Classification Search
    CPC .. H01L 39/143; H01L 39/2464; Y02E 40/642
    See application file for complete search history.

(56) References Cited

FOREIGN PATENT DOCUMENTS

| | | |
|---|---|---|
| JP | 2009-218008 | 9/2009 |
| JP | 2011-96566 | 5/2011 |
| JP | 2011-522380 | 7/2011 |
| JP | 2013-12406 | 1/2013 |
| JP | 2013-503422 | 1/2013 |

OTHER PUBLICATIONS

International Search Report for International Application No. PCT/JP2015/072393 (with translation), dated Nov. 2, 2015, 4 pgs.

\* cited by examiner

PARTIAL BENDING

ENTIRE BENDING

STRESS CONCENTRATION

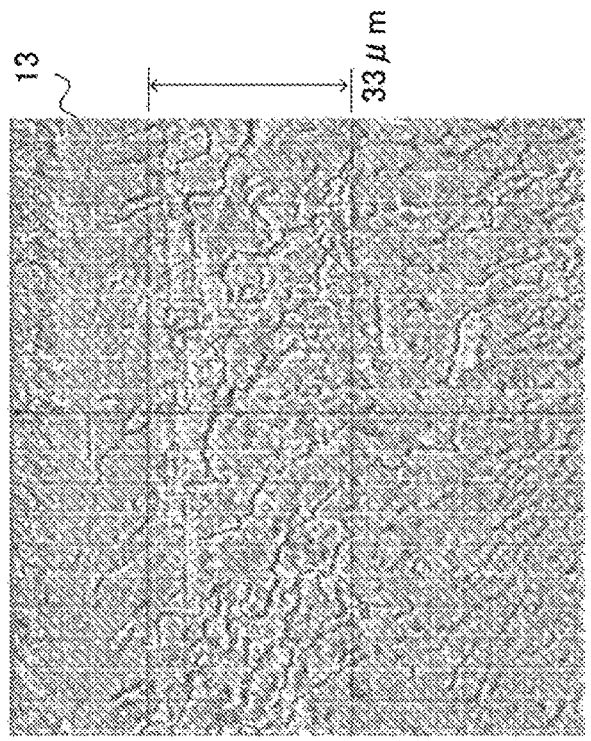
FIG. 5(c) REBCO LAYER SURFACE
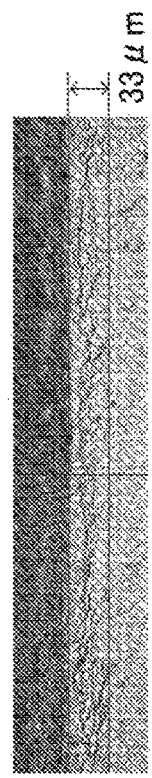
FIG. 5(d) REBCO LAYER SURFACE
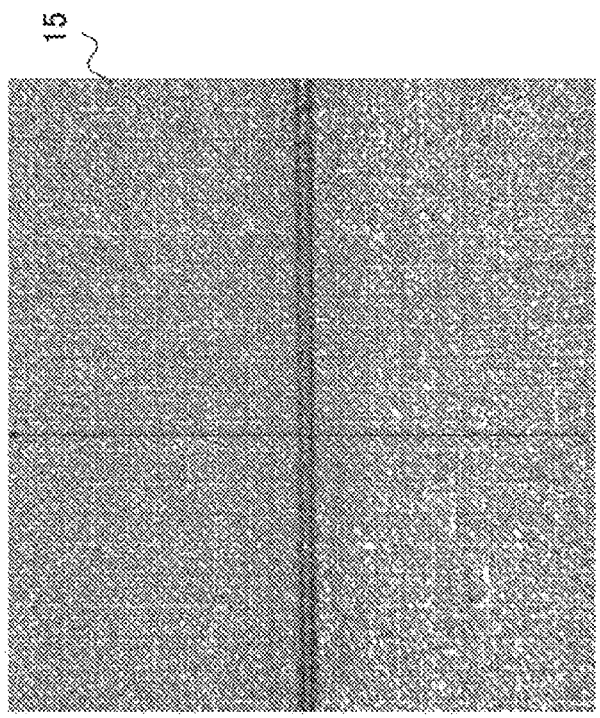
FIG. 5(a) Cu SURFACE
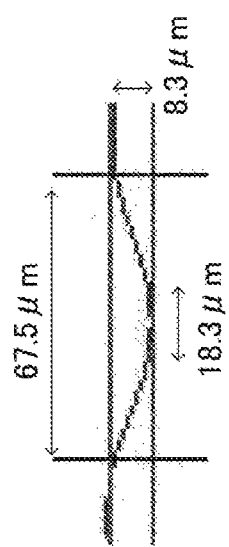
FIG. 5(b) Cu SURFACE SLIT SECTION

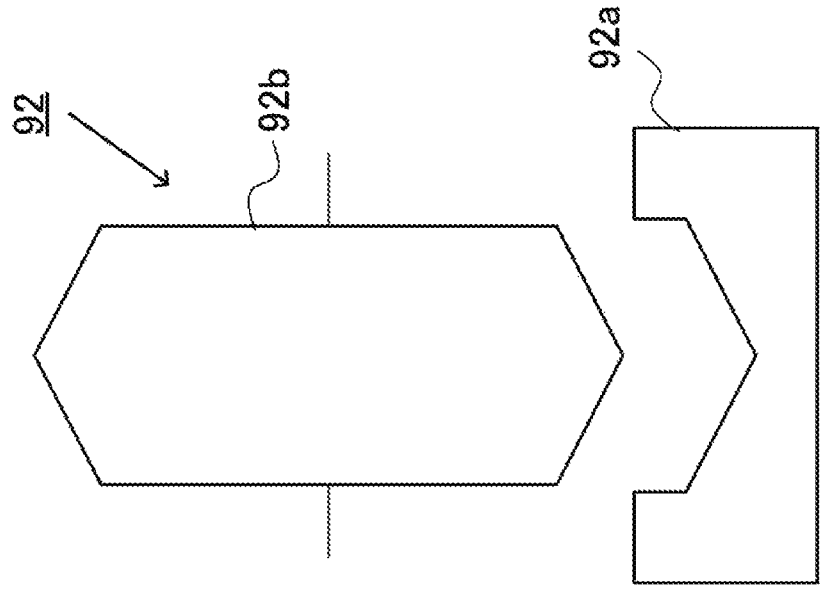
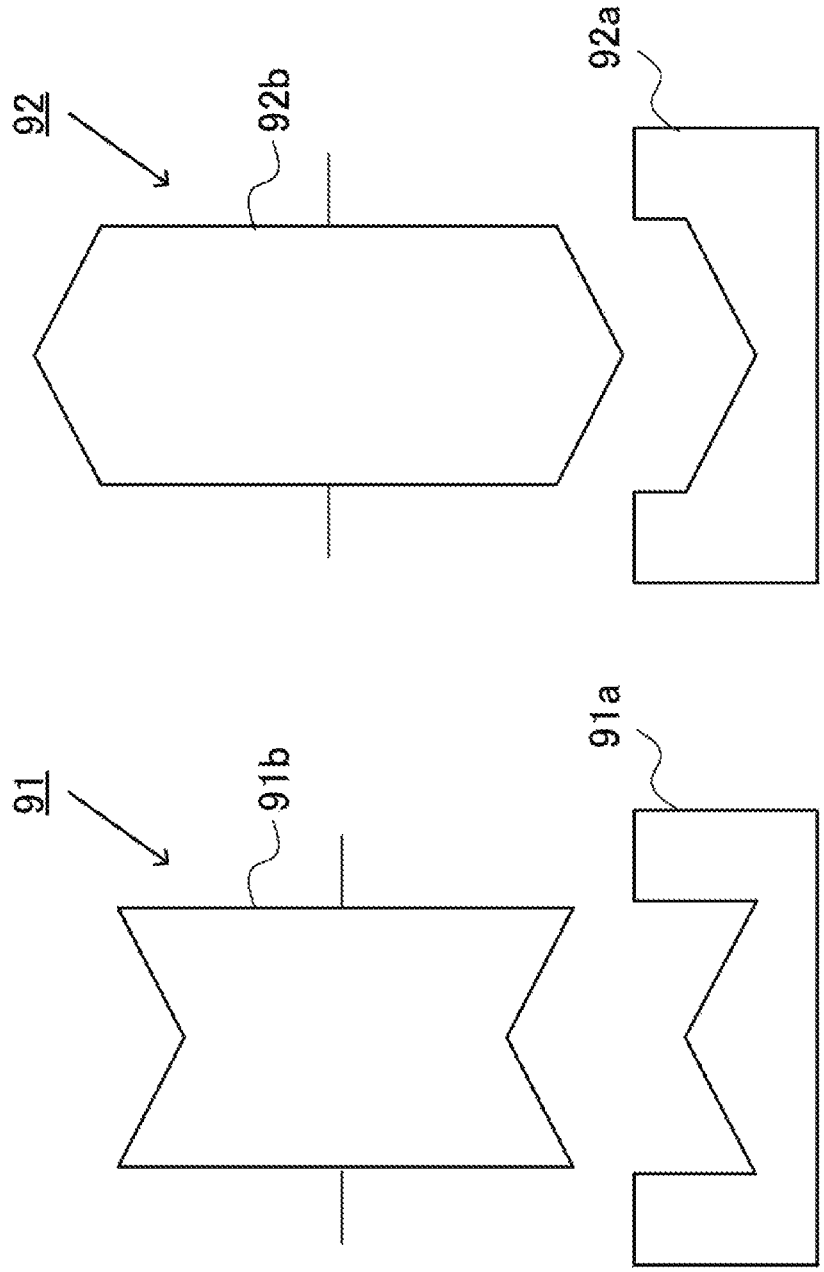

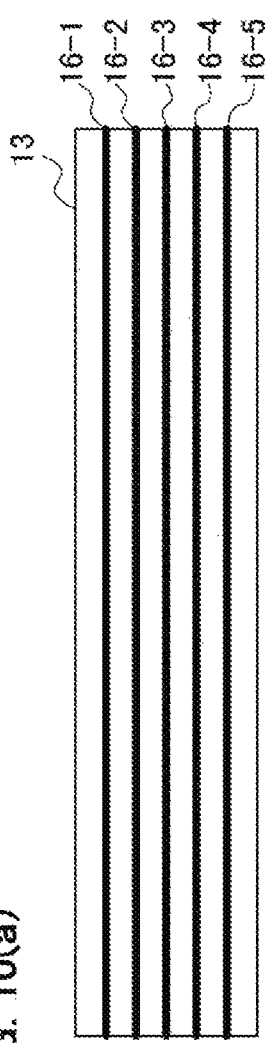
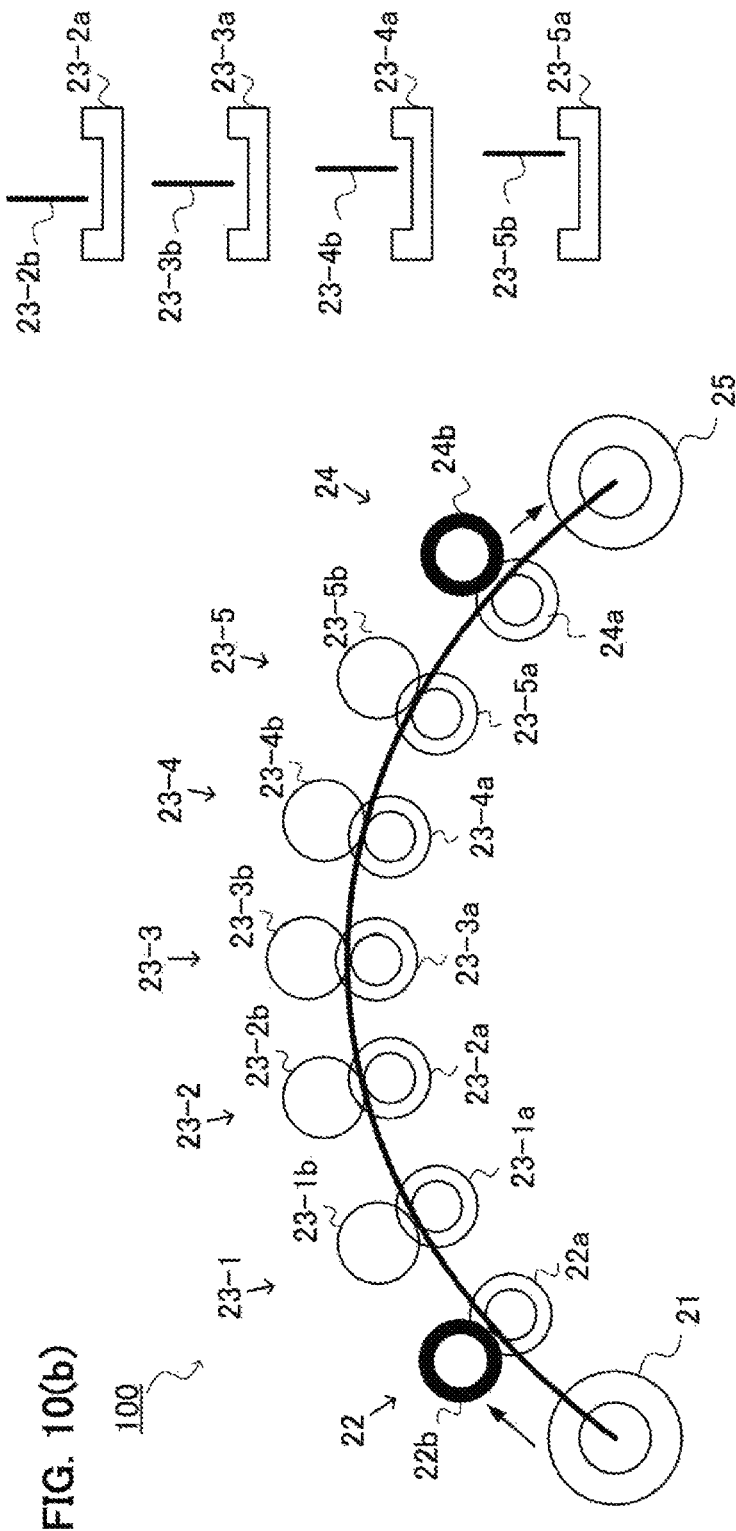
FIG. 10(a)
FIG. 10(b)
FIG. 10(c)

HIGH TEMPERATURE SUPERCONDUCTING MULTICORE TAPE WIRE, AND MANUFACTURING METHOD THEREOF AND MANUFACTURING DEVICE

TECHNICAL FIELD

The present invention relates to a high-temperature multi-filamentary superconducting tape wire produced by dividing a superconducting layer into filaments and a method and a device for manufacturing the same.

BACKGROUND ART

Superconducting wires have been widely used for example in NMR (Nuclear Magnetic Resonance) devices and MRI (Magnetic Resonance Imaging) devices. In recent years, rare earth-based high temperature superconducting wires (REBCO wires) have been put into production, and research and development using these wires have been ongoing.

In a coil made of a superconducting wire, a superconducting layer must have a filamentary structure in order to reduce a screening current-induced magnetic field or AC loss. However, orientation must be in a uniform direction in crystal growth in order to produce a REBCO wire having high critical current, and therefore, a single-filamentary tape wire having a width of several mm and a thickness of several hundred μm is typically produced, rather than a multi-filamentary wire having a circular cross section as in the case of a NbTi wire. As a solution to the problem, a scribing wire produced by forming a number of lengthwise grooves on a wire substrate and forming a superconducting layer into multiple filaments has been suggested, and mechanical grinding, chemical etching, and cutting by laser irradiation, etc., have been suggested as scribing methods (PTL 1).

SUMMARY OF INVENTION

Technical Problem

It has been reported however that in a scribing method by mechanical grinding or chemical etching, the minimum groove width between filaments is about 0.2 mm, and critical current is reduced by about half when a plurality of grooves are formed (NPL 1). The methods may cut a stabilizing layer, and the mechanical strength of the wire may be lowered.

In the meantime, in a scribing method by laser irradiation, the groove width can be reduced when the laser spot diameter is reduced, and therefore it is expected that AC loss is reduced as compared with the mechanical grinding or chemical etching. However, in the method, melt (waste) derived from the material of the stabilizing layer remains in the grooves between the filaments, so that the electrical resistance between the filaments is reduced, and a reducing effect in AC loss cannot be obtained as a result of a coupling effect (PTL 2 and PTL 3). Therefore, scribing should be carried out slowly by weak laser irradiation at a speed about as low as several m/h, and process for removing the melt (such as etching) should be carried out in addition to the laser irradiation process, which may complicate the manufacturing process or increase the cost. Similarly to the case of the mechanical grinding and the chemical etching, the stabilizing layer may be disconnected, and therefore there is still a disadvantage in terms of the mechanical strength of the wire.

In view of the disadvantage, it is an object of the present invention to provide a high temperature superconducting wire having a filamentary superconducting layer in a simplified manner and in quantity without degrading the superconducting properties and mechanical strength.

Solution to Problem

The first aspect of the present invention is a method for manufacturing a high temperature multi-filamentary superconducting tape wire having an oxide superconducting layer formed on a tape-shaped metal substrate with an intermediate layer therebetween and a stabilizing layer formed on the oxide superconducting layer, the oxide superconducting layer and the intermediate layer being provided with one or more lengthwise slits, and the metal substrate and the stabilizing layer not being provided with a slit. The method according to the first aspect includes the steps of: preparing a high temperature superconducting wire having an oxide superconducting layer formed on a tape-shaped metal substrate with an intermediate layer therebetween and a metal stabilizing layer formed on the oxide superconducting layer; and forming a slit either by bending the high temperature superconducting wire in a lengthwise direction thereof or concentrating stress on the high temperature superconducting wire in the lengthwise direction.

Herein, in a high temperature superconducting wire having a multi-layer structure including an oxide superconducting layer formed on a metal substrate with an intermediate layer therebetween and a metal stabilizing layer formed on the oxide superconducting layer, a lengthwise slit formed in the oxide superconducting layer and the intermediate layer or only in the oxide superconducting layer is referred to as an "internal slit." The internal slit may be continuous or discontinuous in the lengthwise direction. The high temperature multi-filamentary superconducting tape wire according to the present invention may be referred to as a high temperature superconducting wire having an internal slit. The slit forming step may be referred to as a step of forming an internal slit in the high temperature superconducting wire.

Forming a slit in a material means that the material is cut in the location. In particular, forming a slit in an oxide superconducting layer means that the part is cut so that superconducting current is not passed therethrough.

Herein, bending a wire in the lengthwise direction means that bending the wire along a folding line in the lengthwise direction. Further, concentrating stress means that a stress concentration point is in the widthwise direction of the wire.

According to the manufacturing method, a load applied on the high temperature superconducting wire cuts the oxide superconducting layer (and the intermediate layer) as a ceramic material, while the metal substrate and the stabilizing layer can be recovered and prevented from being cut. Therefore, a slit can be provided only in the oxide superconducting layer and the intermediate layer. Since the oxide superconducting layer is divided by the slit, the oxide superconducting layer can have a filamentary structure, and diamagnetism with respect to a magnetic field perpendicular to the surface of the wire can be reduced. Therefore, a superconducting coil produced using such high temperature multi-filamentary superconducting tape wire can reduce screening current-induced magnetic field and reduce AC loss. Since the metal substrate and the stabilizing layer are not cut, the mechanical strength is not much reduced. When the oxide superconducting layer is cut by applying a load, the slit width can be smaller than the groove width (damage size) by mechanical grinding or chemical etching, so that degradation in the superconducting properties can be reduced. Therefore, an increased number of slits may be formed and the oxide superconducting layer can have a significantly finer filamentary structure.

In the slit forming step according to the present invention, a method of bending the high temperature superconducting wire in the lengthwise direction, a method of concentrating stress without deforming the high temperature superconducting wire, and both the bending and stress concentration methods can be applied. In the bending method, the oxide superconducting layer may be bent by applying only in a part in the widthwise direction (partial bending) or bent by applying a load entirely in the widthwise direction (entire bending). The magnitude of the load to be applied is about the level that allows the oxide superconducting layer to be cut but allows the metal substrate and the stabilizing layer to be recovered and remain uncut.

In the slit forming step according to the present invention, the slit can be formed by pressing an edge member against the high temperature superconducting wire. Here, the edge member is pressed against a wire placed on a soft member, so that the part against which the edge part is pressed can be bent. When the edge member is pressed against a wire placed on a hard member, stress can be concentrated on the part against which the edge member is pressed.

For example, when a high temperature superconducting wire is passed between a rotating edge member and a guide roller provided opposed to each other, a load is applied only on a part of the high temperature superconducting wire in the widthwise direction, so that the wire can be bent in the lengthwise direction or stress can be concentrated. By the method, a long high temperature superconducting wire can be provided with a continuous slit in a simplified manner. Here, if a rotating edge member which does not have the edge member at a part of the circumference is used, the wire is discontinuously bent or stress is concentrated, so that a slit can be formed discontinuously in the lengthwise direction. The lengthwise discontinuous slit may be referred to as a lengthwise broken-line shaped slit. Another method for forming a broken-line shaped slit is to reduce an applied load compared to that required to form a complete slit in the wire during processing. When the slit is discontinuously provided, the region between the filaments may have a shunt function, which can improve the critical current and reduce the coupling effect.

In the slit forming step according to the present invention, a plurality of slits may be provided by passing the wire against a plurality of rotating edge members having edges in different widthwise positions. A plurality of slits may be formed by passing the wire along a rotating edge member including a plurality of edges in different widthwise positions.

When the entire bending approach is employed, in the slit forming step according to the present invention, a slit may be formed by applying a load by embossing processing on a high temperature superconducting wire entirely in the widthwise direction and thus bending the high temperature superconducting wire into a V-shape. By this approach, a slit may be provided at a corner of the V-shape.

For example, a slit may be formed by passing the high temperature superconducting wire between a first roller having an outer circumference in a raised V-shape and a second roller having an outer circumference in a recessed V-shape provided opposed to each other and thus bending the wire into a V-shape. By this approach, a continuous slit may be formed in a long high temperature superconducting wire in a simplified manner. Here, if at least one of the outer circumferences of the first roller and the second roller is provided with a notch part, and the rollers do not allow embossing processing to be carried out in the location of the notch part, a discontinuous slit (broken-line shaped slit) may be formed.

In the slit forming step according to the present invention, a plurality of slits may be provided by passing the wire between a plurality of sets of first and second rollers having V mountain parts arranged in different widthwise positions.

The second aspect of the present invention is a high temperature multi-filamentary superconducting tape wire having an oxide superconducting layer formed on a tape-shaped metal substrate with an intermediate layer therebetween and a metal stabilizing layer formed on the oxide superconducting layer, wherein the oxide superconducting layer and the intermediate layer are provided with one or more lengthwise slits, and the metal substrate and the stabilizing layer are not provided with a slit.

According to the aspect, the oxide superconducting layer may include $REBa_2Cu_3O_{7-\delta}$ (where RE is one or more rare-earth elements). The stabilizing layer may be formed only on the oxide superconducting layer or around the oxide superconducting layer and the metal substrate. The stabilizing layer may have a single layer structure or a multi-layer structure.

The width of the internal slit is preferably 200 µm or less, more preferably 50 µm or less, even more preferably 30 µm or less.

The internal slit according to the present invention may be continuously or discontinuously formed in the lengthwise direction. When forming a discontinuous slit longer than the slit interval in the widthwise direction of the wire, the length of the part without a slit (the slit disconnected part) has preferably a length not less than the widthwise length (filament width) of the high temperature superconducting wire having the filamentary structure. In this way, the shunt function between the slits can be optimized, and the critical current can be improved. The length of each slit is set to an appropriate value depending on the shape of a coil to be produced using the high temperature multi-filamentary superconducting tape wire, which preferably is equal or greater than the diameter of the coil. Here, the slit interval does not have to be equidistant. The slit interval refers to the distance between adjacent slits and to the shortest distance in the widthwise direction when the slits are not parallel to each other.

Third aspect of the present invention is a device for manufacturing a high temperature multi-filamentary superconducting tape wire including a guide roller, a rotating edge member provided opposed to the guide roller, and a take-up portion and a feed portion for feeding the high temperature superconducting wire between the guide roller and the rotating edge member.

The fourth aspect of the present invention is a device for manufacturing a high temperature multi-filamentary superconducting tape wire including a first roller having an outer circumference in a raised shape, a second roller provided opposed to the first roller and having an outer circumference in a recessed shape, and a take-up portion and a feed portion for feeding a high temperature superconducting wire between the first roller and the second roller.

Using these devices, a multi-filamentary superconducting tape wire in which only the oxide superconducting layer and the intermediate layer are cut and the metal substrate and the stabilizing layer are not cut can be produced in a simplified manner and for a short period of time.

Furthermore, the present invention may also relate to a superconducting coil made of a high temperature superconducting wire in any of the above-described connection arrangement.

Advantageous Effects of Invention

According to the present invention, a high temperature superconducting wire having a filamentary superconducting layer can be produced in a simplified manner substantially without degrading the superconducting properties and the mechanical strength. The presence of the filamentary superconducting layer can reduce diamagnetism with respect to a magnetic field perpendicular to the surface of the wire, so that a superconducting coil made of the high temperature superconducting wire may reduce screening current-induced magnetic field and reduced AC loss.

BRIEF DESCRIPTION OF DRAWINGS

FIGS. 5(a) to 5(d) illustrate results of appearance observation of a copper stabilizing layer surface and a REBCO layer surface in the REBCO multi-filamentary tape wire according to the first embodiment.

FIGS. 9(a) and 9(b) are views showing modifications of the device and method for manufacturing the REBCO multi-filamentary tape wire according to the first embodiment.

FIGS. 10(a) to 10(c) are schematic views for illustrating the configuration of a REBCO multi-filamentary tape wire and a manufacturing method therefor according to a second embodiment.

DESCRIPTION OF EMBODIMENTS

Now, embodiments of the present invention will be described in detail in conjunction with the accompanying drawings by referring to exemplary embodiments. Note however that the sizes, materials, and shapes of components and relative positioning thereof in the following description of the embodiments should not be construed to limit the scope of the present invention only to the described contents unless otherwise specified.

General Description

The present invention relates to a REBCO multi-filamentary tape wire (high-temperature multi-filamentary superconducting tape wire) having slits formed only in a REBCO layer and an intermediate layer (buffer layer) thereof so that these layers are in a filamentary structure and no slits in stabilizing layers. The configuration of the REBCO multi-filamentary tape wire according to the present invention will be described.

Figure 1A:
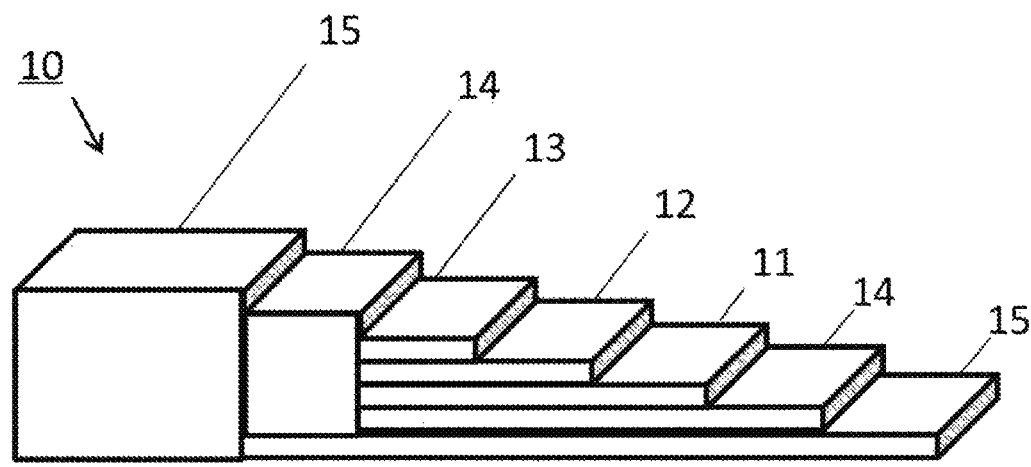
FIGS. 1(a) to 1(d) are views for illustrating the configuration of a REBCO multi-filamentary tape wire according to the present invention.
Figure 1B:
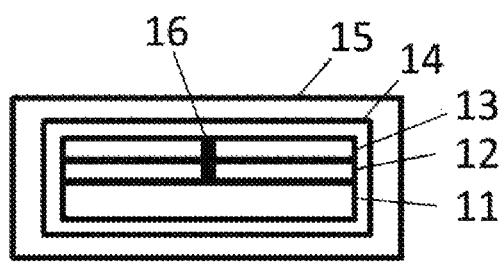
Figure 1C:
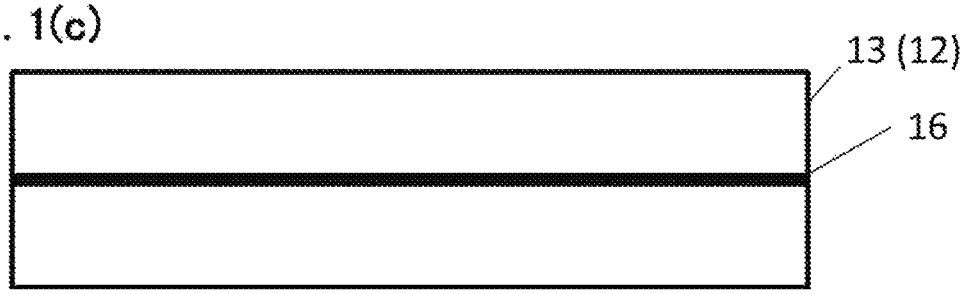
Figure 1D:

The configuration of a REBCO multi-filamentary tape wire 10 is shown in FIG. 1(a). The REBCO multi-filamentary tape wire 10 according to one embodiment has a multi-layer structure including a metal substrate 11, an intermediate layer 12, a REBCO layer 13, a silver stabilizing layer 14, and a copper stabilizing layer 15. Here, as shown in FIGS. 1(b) to 1(d), the REBCO layer 13 and the intermediate layer 12 are provided with a slit 16 along the lengthwise direction of the REBCO multi-filamentary tape wire 10 while the silver stabilizing layer 14 and the copper stabilizing layer 15 are not provided with such a slit. The intermediate layer 12 does not always have to be provided with such a slit. Note that FIG. 1(b) is a vertical sectional view of the REBCO multi-filamentary tape wire 10, FIG. 1(c) is a top view of the REBCO layer 13 and the intermediate layer 12, and FIG. 1(d) is a top view of the silver stabilizing layer 14 and the copper stabilizing layer 15.

The slit 16 is formed by cutting the REBCO material of the REBCO layer 13 in the location. The slit 16 electrically isolates the REBCO material. The electrical isolation of the REBCO material means that superconducting current is not passed in the location. The REBCO layer 13 is divided into two filaments by the single slit 16, and the thickness of each of the filaments is reduced to half of the thickness in the case without the slit.

Figure 2A:
FIGS. 2(a) and 2(b) are schematic views for illustrating an internal wire slit formed in a REBCO layer in the REBCO multi-filamentary tape wire according to the present invention.

In the illustrated example, the REBCO multi-filamentary tape wire 10 has only the single slit 16, but as shown in FIG. 2(a), a plurality of slits 16 may be formed. The plurality of slits 16 can further reduce the thickness of the REBCO material. The example shown in FIG. 2(a) has three slits but any other number of slits 16 may be provided as far as the superconducting properties are not degraded.

Figure 2B:
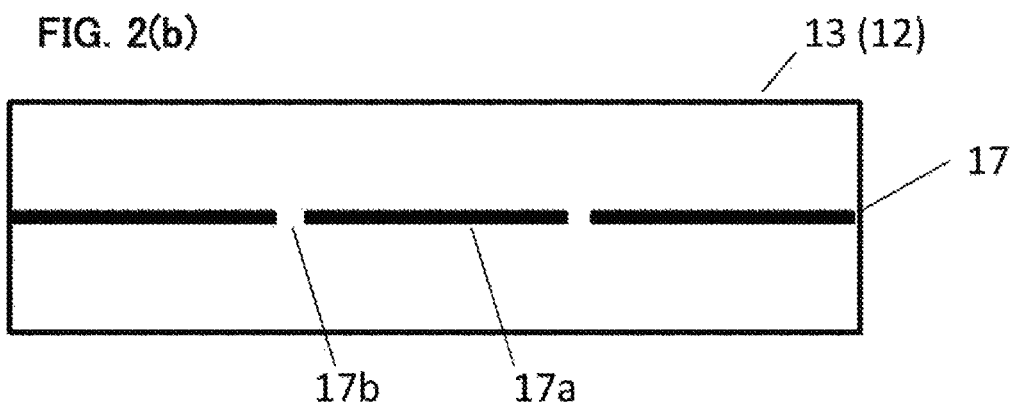

In the illustrated example of the REBCO material, the slit 16 is continuously formed in the lengthwise direction, a slit 17 discontinuously formed in the lengthwise direction may be formed as shown in FIG. 2(b). More specifically, a part 17a with a slit and a part 17b with no slit may be arranged alternatively in the lengthwise direction. The presence of the part 17b without a slit allows the region between the isolated REBCO filaments to have a shunt function, so that the REBCO multi-filamentary tape wire 10 may have improved superconducting properties. Note that a plurality of such discontinuous slits may be formed as described above. Alternatively, a continuous slit and a discontinuous slit may be combined.

Figure 3A:
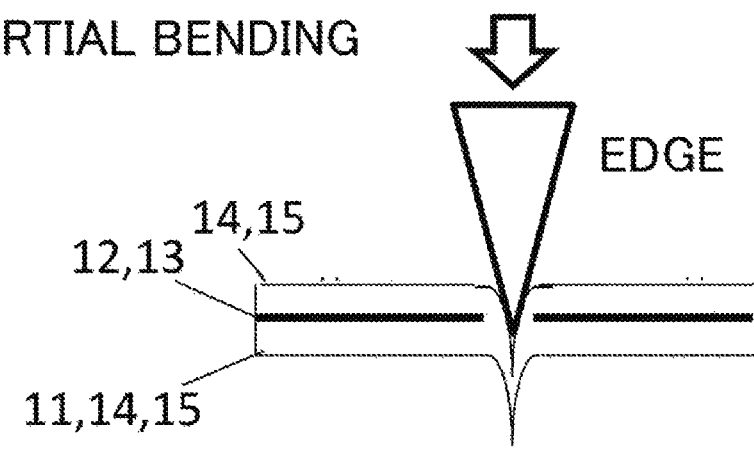
FIGS. 3(a) to 3(c) are schematic views for illustrating a method for manufacturing the REBCO multi-filamentary tape wire according to the present invention.

There may be three main methods for forming the slit. According to a first method, as shown in FIG. 3(a), an edge is pressed against a REBCO wire to partly bend the REBCO wire. The edge is pressed against the REBCO wire on a soft material from above, and the REBCO wire may be partly bent. The REBCO layer 13 and the intermediate layer 12 are made of ceramic and have a small reversible stress limit against bending, while the metal substrate 11 and the stabilizing layers 14 and 15 are made of metal and have greater cutting resistance even if these layers partly plastically deform. Therefore, when the REBCO wire is bent in the lengthwise direction as described above, the REBCO layer 13 and the intermediate layer 12 can be cut without cutting the metal substrate 11 and the stabilizing layers 14 and 15.

Figure 3B:
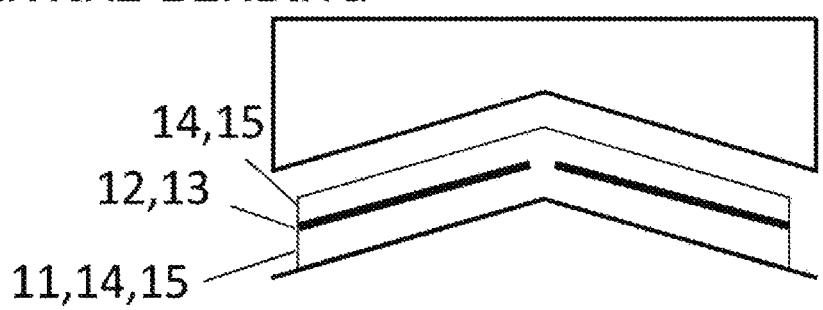
Figure 3C:
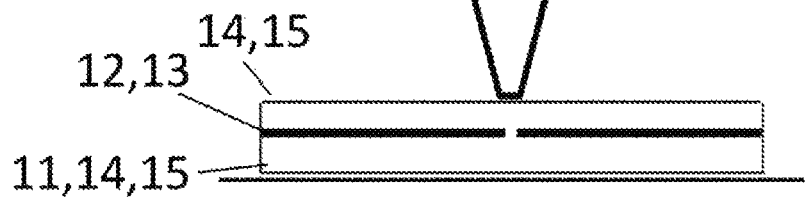

According to a second method, as shown in FIG. 3(b), the entire REBCO wire is provided with stress in the manner of embossing (press working), and the REBCO wire is bent in a V-shape. According to this method, bending in the lengthwise direction allows only the REBCO layer 13 and the intermediate layer 12 to be cut similarly to the above.

A third method is the same as the first method in that an edge is pressed against the REBCO wire but different in that the REBCO wire is placed on a hard member. The REBCO wire placed on the hard member is not bent but the stress concentrates at the part against which the edge pressed. The stress concentration at a straight part along the length allows only the REBCO layer 13 and the intermediate layer 12 to be cut.

Note that the first and second methods form a slit by bending, while the third method forms a slit by stress concentration. Among the slit forming methods by bending, the first method forms a slit by partial bending, while the second method forms a slit by entire bending.

First Embodiment (Manufacturing Method and Manufacturing Device)

A first embodiment of the present invention relates to a REBCO multi-filamentary tape wire having a single continuous slit formed in a REBCO layer thereof. Now, a detailed configuration of the REBCO multi-filamentary tape wire according to the embodiment and a manufacturing method therefor will be described.

A REBCO tape wire having no slit in a REBCO layer is prepared. The wire may be any arbitrary existing REBCO tape wire. Note however that a slit is formed by bending according to the embodiment and therefore the REBCO tape wire is preferably as thin as 0.3 mm or less so that the wire can be processed without much degradation by bending. For example, a SCS4540 wire manufactured by SuperPower Inc. may be used. The REBCO tape wire has a width of 4 mm and a thickness of 0.1 mm and formed as shown in FIG. 1(a). The metal substrate 11 is made of a metal material such as nickel and a nickel alloy, etc., and has a thickness of about 50 μm. The intermediate layer (buffer layer) 12 has a single layer structure or a multi-layer structure made of metal oxide and a thickness of about 0.2 μm. The REBCO layer 13 is made of a rare earth-based oxide superconducting material ($REBa_2CU_3O_{7-\delta}$) and has a thickness of about 1 μm. Here, RE represents one or more rare-earth elements. The rare-earth elements include Sc, Y, La, Ce, Pr, Nd, Pm, Sm, Eu, Gd, Tb, Dy, Ho, Er, Tm, Yb, and Lu. The silver stabilizing layer 14 is made of silver (Ag) and has a thickness of about 1 μm. The copper stabilizing layer 15 is made of copper (Cu) and has a thickness of about 20 μm. In the REBCO tape wire, the stabilizing layers 14 and 15 are provided not only on the REBCO layer 13 but also to cover around the metal substrate 11 to the REBCO layer 13.

The REBCO tape wire is subjected to processing using a slit forming device including a roller slitter (rotary edge member), so that the REBCO layer of the REBCO tape wire is provided with a slit.

Figure 4A:
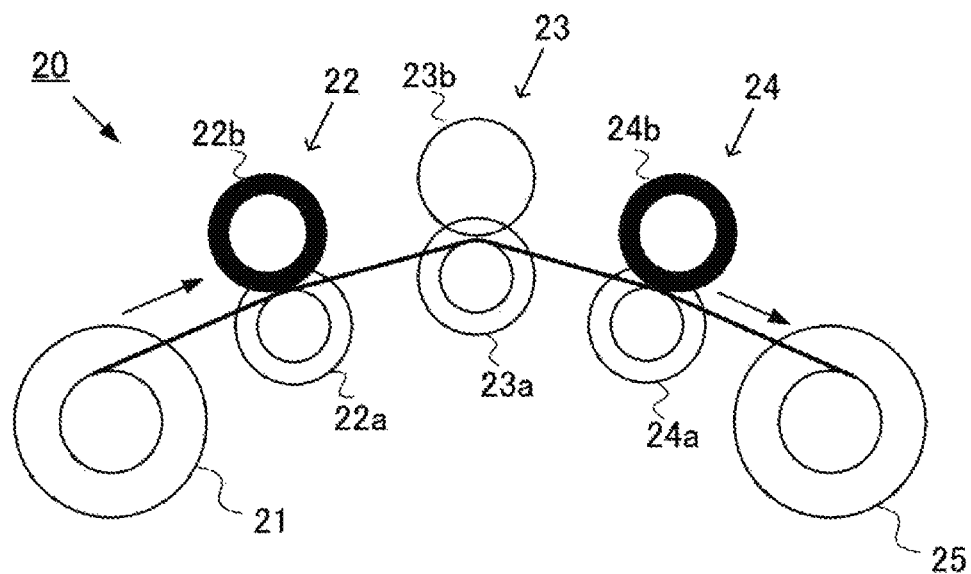
FIGS. 4(a) and 4(b) are schematic views for illustrating a device for manufacturing a REBCO multi-filamentary tape wire according to a first embodiment.

The structure of a slit forming device 20 will be described with reference to FIG. 4. FIG. 4(a) shows a general overview of the slit forming device 20. The slit forming device includes a feed portion 21, a guide roller pair 22, a slit forming roller pair 23, a guide roller pair 24, and a take-up portion 25.

The feed portion 21 includes a reel having a REBCO tape wire wound therearound, and the take-up portion 25 includes an electric roller adapted to take up the REBCO tape wire. The take-up portion 25 takes up the REBCO tape wire, so that the REBCO tape wire travels between the feed portion 21 and the take-up portion 25. Note that the reel of the feed portion 21 is provided with a brake that provides rotation force reverse from the traveling direction to generate a certain level of tension on the REBCO tape wire. According to the embodiment, it is appropriate that the tension is approximately from 10 MPa to 50 MPa.

The guide roller pair 22 is adapted to regulate the movement of the REBCO tape wire in the width-wise direction. The guide roller pair 22 includes a lower roller 22a and an upper roller 22b provided opposed to each other. The lower roller 22a has a groove (recessed part) about as wide as the width of the tape wire (4 mm) at an outer circumference thereof similarly to a guide roller 23a that will be described. The upper roller 22b has a raised part that is fitted to the groove of the lower roller 22a. The lower roller 22a and the upper roller 22b sandwich the REBCO tape wire in the groove, so that the REBCO tape wire is positioned in the widthwise direction. The guide roller pair 24 has the same structure as the guide roller pair 22.

Figure 4B:
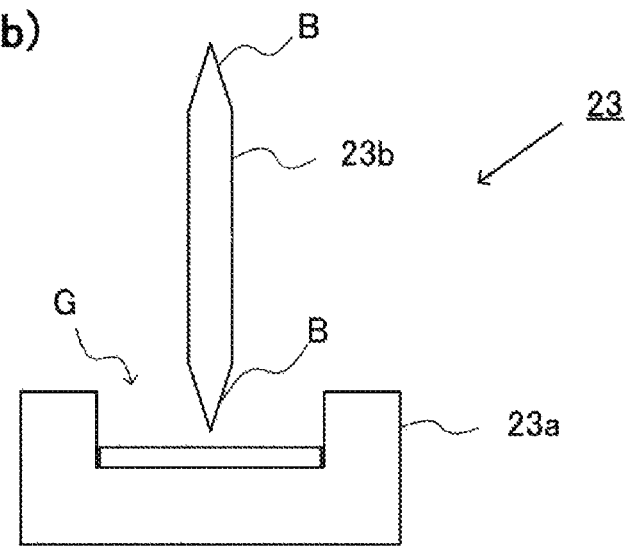

The slit forming roller pair 23 is adapted to form a slit in the REBCO layer (and the intermediate layer) of the REBCO tape wire. The slit forming roller pair 23 includes the guide roller 23a and a roller slitter 23b provided opposed to each other. FIG. 4(b) is a view of the slit forming roller pair 23 as viewed in the traveling direction of the tape wire.

The guide roller 23a has a groove (recessed part) G as wide as the width of the tape wire (4 mm) at an outer circumference thereof. At least the bottom surface of the groove part is made of a soft material such as a polyacetal (POM), polypropylene (PP), and polyethylene (PE). In this way, the REBCO tape wire may be bent when stress is applied on the REBCO tape wire by the roller slitter 23b.

The roller slitter 23b has its entire outer circumference provided with an edge (edge member) B. The material of the edge member B may be any arbitrary material having sufficient hardness and may be for example cemented carbide which is normally used for a cutter edge. The edge has a width of 20 μm according to the embodiment. The roller slitter 23b is connected with a stress controller so that prescribed stress can be applied. The prescribed stress can cut the REBCO layer 13 (and the intermediate layer 12) when applied to bend the REBCO tape wire but leave the metal substrate 11 and the stabilizing layers 14 and 15 uncut. The prescribed stress differs depending on the size of the edge or the materials of the REBCO tape wire to be processed or the guide roller 23a. According to the embodiment, the applied stress is set to 50 N, so that the concentration stress of the edge becomes about from 100 MPa to 300 MPa. The stress controller includes a load cell (stress detector) and a stress application unit that applies stress in response to the outputs of the load cell. Alternatively, the stress controller may be a spring adapted to bias the roller slitter 23b toward the guide roller 23a.

The guide roller pairs 22 and 24 are positioned below the slit forming roller pair 23 (on the side of the guide roller 23a) so that the REBCO tape wire has a curved shape raised to the side of the roller slitter 23b in the position of the slit forming roller pair 23. In this way, the contact area between the REBCO tape wire and the guide roller 23a increases, and sufficient widthwise regulation can be provided. The contact area between the REBCO tape wire and the roller slitter 23b is reduced, and advantageous effects are provided in that, e.g., the movement of the roller slitter 23b in the transverse direction (the widthwise direction of the tape wire) can be reduced and the V-shaped bending of the REBCO tape wire can be reduced.

The REBCO tape wire is passed between the slit forming roller pair 23 of the slit forming device 20 having the above structure, so that the REBCO tape wire is bent along the longitudinal direction to have a lengthwise slit in the REBCO layer 13 (and the intermediate layer 12).

The REBCO tape wire is bent by the slit forming roller pair 23 and deforms but the guide roller pair 24 can return the REBCO tape wire to the flat shape.

Note that the slit forming device 20 may have a more simplified structure. For example, the REBCO tape wire may be moved manually instead of providing the feed portion 21 and the take-up portion 25 and provided with a slit by the slit forming roller pair 23. Alternatively, one or both of the guide roller pairs 22 and 24 may be omitted.

Measurement Results

The features of the thus produced REBCO multi-filamentary tape wire will be described.

Appearance Observation

The surface of the copper stabilizing layer 15 was observed using a three-dimensional microscope, and the result is given in FIGS. 5(*a*) and 5(*b*). FIG. 5(*a*) shows the result of observation of a part including a location of the surface of the copper stabilizing layer 15 against which the roller slitter 23b was pressed. The left-right direction in the figure represents the lengthwise direction of the tape wire, and the up-down direction represents the widthwise direction thereof. As can be understood from FIG. 5(*a*), the part against which the roller slitter 23b was pressed has a groove. FIG. 5(*b*) shows a section of the groove part of the copper stabilizing layer 15. The groove part had a width of 67.5 μm at an upper end thereof, a width of 18.3 μm at a lower end thereof, and a depth of 8.3 μm. The copper stabilizing layer 15 had a thickness of about 20 μm, which indicates that the copper stabilizing layer 15 was not cut by the slit forming processing.

The result of observation of the surface of the REBCO layer using the three-dimensional microscope will be described. FIGS. 5(*c*) and 5(*d*) show the result of observation of the surface of the REBCO layer 13 exposed after the metal substrate 11 was removed from the REBCO layer 13 using the three-dimensional microscope. FIG. 5(*c*) is the result of observation of the part including the location against which the roller slitter 23b was pressed. The left-right direction in the figure represents the lengthwise direction of the tape wire, the up-down direction represents the widthwise direction thereof, and the figure shows an area for about 70 μm each in the lengthwise and widthwise directions including the part against which the roller slitter 23b was pressed. A wrinkled trace of fracture was observed about in the center of the figure. The part with the fracture had a width of about 33 μm and a depth of about 3.3 μm. The part corresponds to a slit formed by the slit forming device 20. As can be seen, the REBCO layer was not crushed (not powdered) in the location of the slit. Since the part was not crushed, the adhesion strength of the slit part is maintained, and the mechanical strength of the wire can be substantially maintained. FIG. 5(*d*) shows a greater area around the part against which the roller slitter 23b was pressed. As can be seen from the figure, the slit was formed continuously at a prescribed width in the lengthwise direction (in the left-right direction in the figure).

Magnetization Measurement

Figure 6:
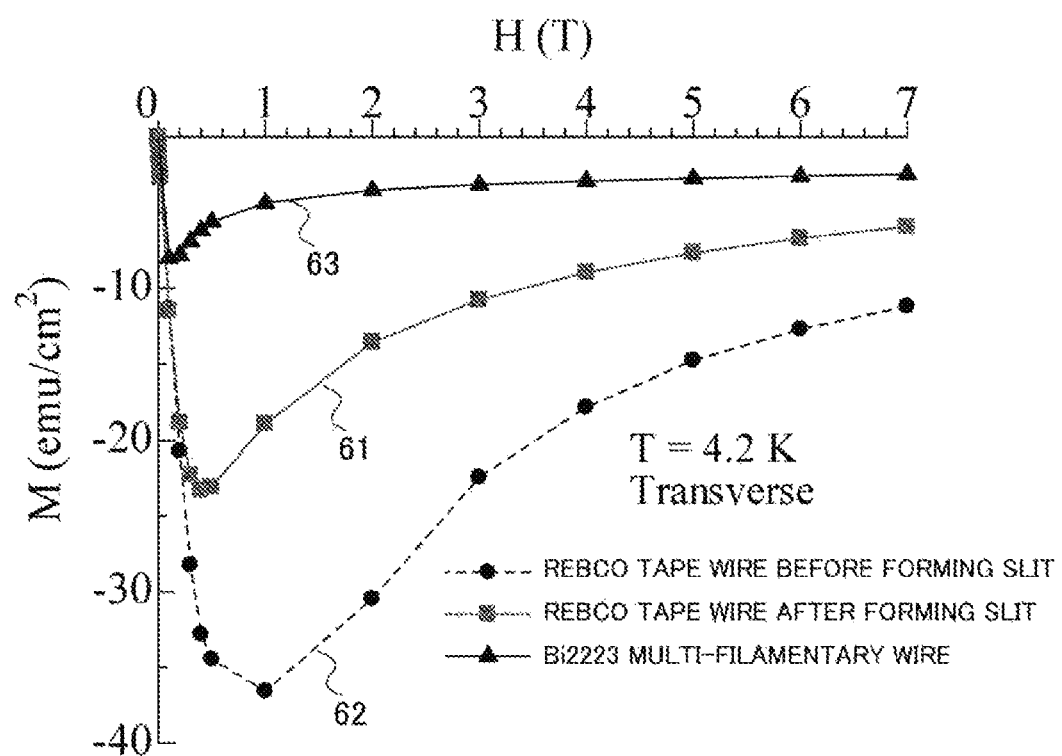
FIG. 6 is a graph showing a result of magnetization measurement of the REBCO multi-filamentary tape wire according to the first embodiment.

Magnetization measurement of the REBCO multi-filamentary tape wire provided with the slit will be described. FIG. 6 shows the relation between applied magnetic fields and magnetization intensities measured using a SQUID magnetometer (MPMS manufactured by Quantum Design Japan, Inc.). In the magnetization measurement, two REBCO multi-filamentary tape wires placed on each other and each having a length of 4 mm were measured as a sample. During the measurement, the sample was refrigerated to 4.2 K with no magnetic field applied and then measured for magnetization while a magnetic field perpendicular to the tape surface was applied and the tape was kept at 4.2 K.

The abscissa in the graph in FIG. 6 represents the intensity of the applied magnetic field and the ordinate represent the intensity of the magnetization of the sample. As samples for comparison, a REBCO tape wire before being provided with a slit and a Bi2223 multi-filamentary wire available in an existing NMR device were similarly measured for magnetization. In the graph in FIG. 6, the measurement result of the REBCO tape wire (REBCO multi-filamentary tape wire) with a slit is designated by 61, the REBCO tape wire with no slit is designated by 62, and the measurement result of the Bi2223 multi-filamentary wire is designated by 63.

As can be understood from FIG. 6, the REBCO multi-filamentary tape wire provided with the slit had significantly improved diamagnetism as compared with the REBCO tape wire without a slit. The reduction in the diamagnetism can reduce a screening current-induced magnetic field or AC loss in a superconducting coil.

Measurement of Current-Voltage Characteristic

Measurement of current-voltage characteristic of the REBCO multi-filamentary tape wire with the slit will be described.

Figure 7A:
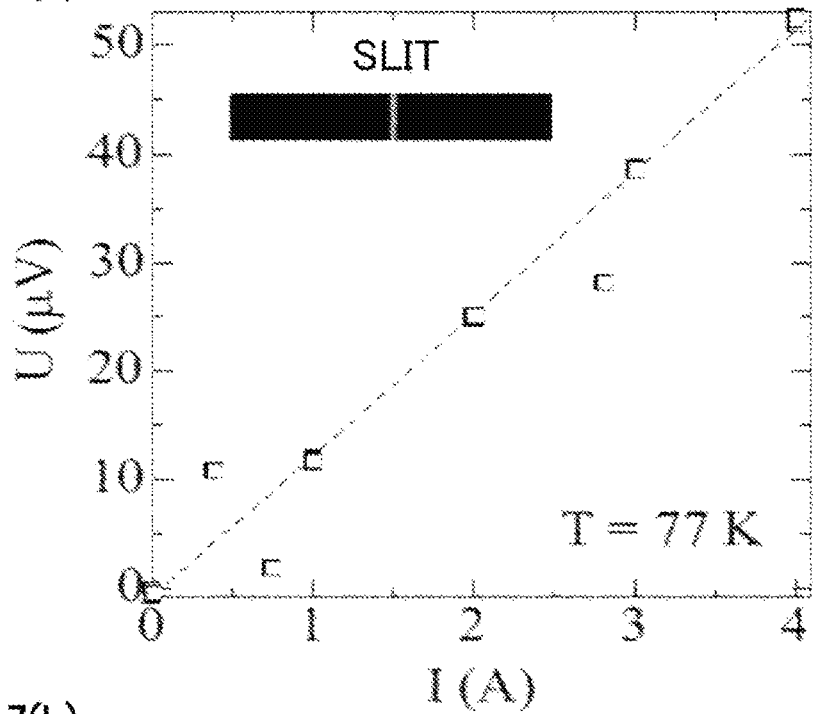
FIGS. 7(a) and 7(b) are graphs showing results of current-voltage characteristic measurement of the REBCO multi-filamentary tape wire according to the first embodiment.
Figure 7B:
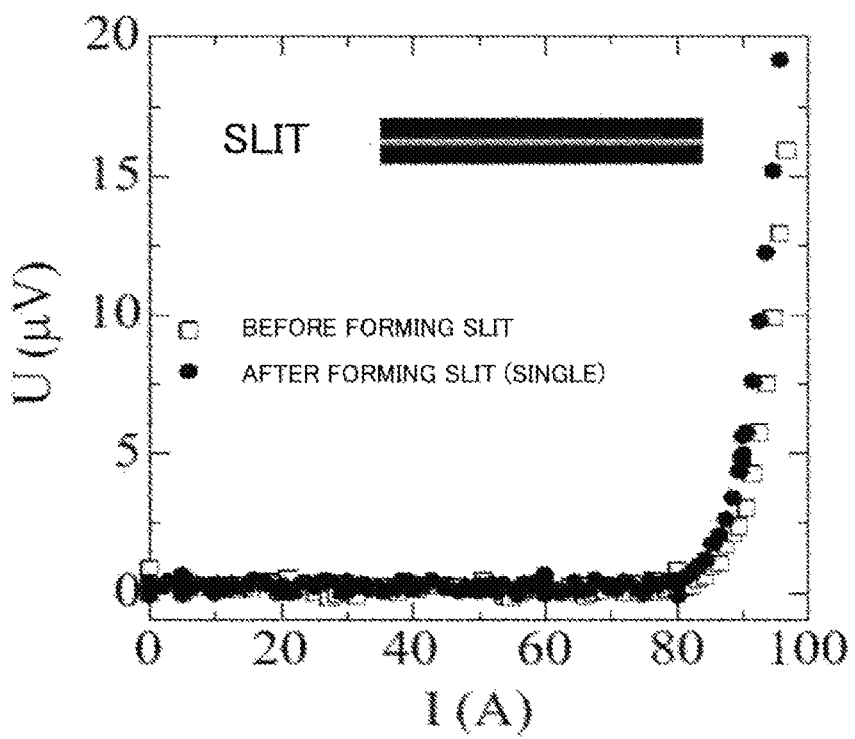

First, in order to confirm electrical isolation achieved by providing the slit, a sample of a REBCO tape wire having a width of 4 mm and a length of 70 mm and provided with a slit in the widthwise direction was prepared and measured for current-voltage characteristic across the slit. The measurement procedure was as follows. The sample provided with voltage terminals at an interval of 10 mm across the slit was placed in liquid nitrogen (77 K) and measured for voltage while the current passed through the sample was raised at 10 A/min. There was no externally applied magnetic field at the time. The resulting current-voltage characteristic curve is given in FIG. 7(*a*). As can be understood from the result, superconducting current was not passed through the sample, and the REBCO layer (superconducting layer) was completely cut (electrically isolated) by the slit.

Then, the REBCO multi-filamentary tape wire provided with the slit in the lengthwise direction of the tape wire was measured for critical current. Voltage terminals were placed at intervals of 10 mm in the lengthwise direction, and the entire REBCO wire was measured for current-voltage characteristic. In the same procedure as the above, the sample was refrigerated in liquid nitrogen (77 K) and the current was raised at 10 A/min with no externally applied magnetic field. The resulting current-voltage characteristic curve is given in FIG. 7(*b*). Note that FIG. 7(*b*) shows the current-voltage characteristic of the REBCO multi-filamentary tape wire (black dots) as well as the current-voltage characteristic of a REBCO tape wire before being provided with a slit (squares). The reference for critical current was defined as 1

μV/cm. As can be understood from the result, the critical current was reduced only by about 1% by forming the single slit.

Measurement of Mechanical Strength

Measurement of the mechanical strength of the REBCO multi-filamentary tape wire provided with the slit will be described.

The REBCO multi-filamentary tape wire according to the embodiment was measured for reversible stress limit. The measurement procedure was as follows. Voltage terminals were provided at intervals of 10 mm at a sample of the REBCO multi-filamentary tape wire having a length of 40 mm and a width of 4 mm and provided with a slit in the lengthwise direction. The sample was fixed for 10 mm at each end using a tensile jig, placed in liquid nitrogen (77 K), provided with current therethrough while being drawn, and measured for voltage. There was no externally applied magnetic field, and the current was raised at a rate from 50 A/min to 100 A/min.

Figure 8A:
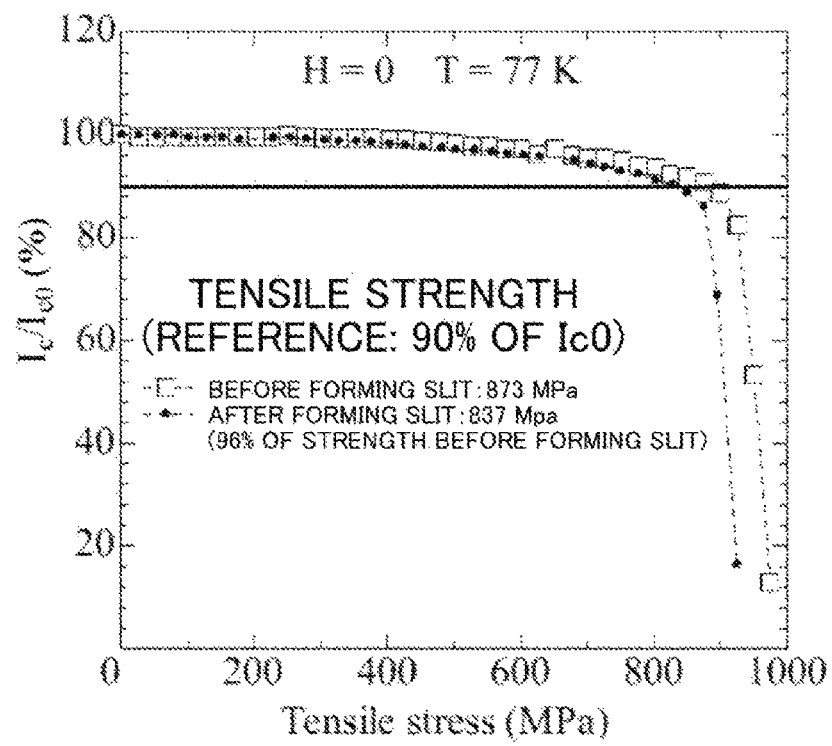
FIGS. 8(a) and 8(b) are graphs showing results of mechanical strength measurement of the REBCO multi-filamentary tape wire according to the first embodiment.

The result is given in FIG. 8(a). The abscissa in FIG. 8(a) represents the tension, and the ordinate represents the critical current (normalized with respect to critical current under no tension). Here, when stress for 90% of the critical current is defined as the tensile strength, the tensile strength of the REBCO multi-filamentary tape wire according to the embodiment is about 837 MPa. Note that FIG. 8(a) shows the result of the same procedure for the REBCO tape wire before being provided with the slit, and the tensile strength thereof was about 873 MPa. As can be understood from the result of the experiment, in the REBCO multi-filamentary tape wire according to the embodiment, degradation in the mechanical strength by forming the slit was as small as about 4%, and the wire had a very high mechanical strength of at least 800 MPa.

Figure 8B:
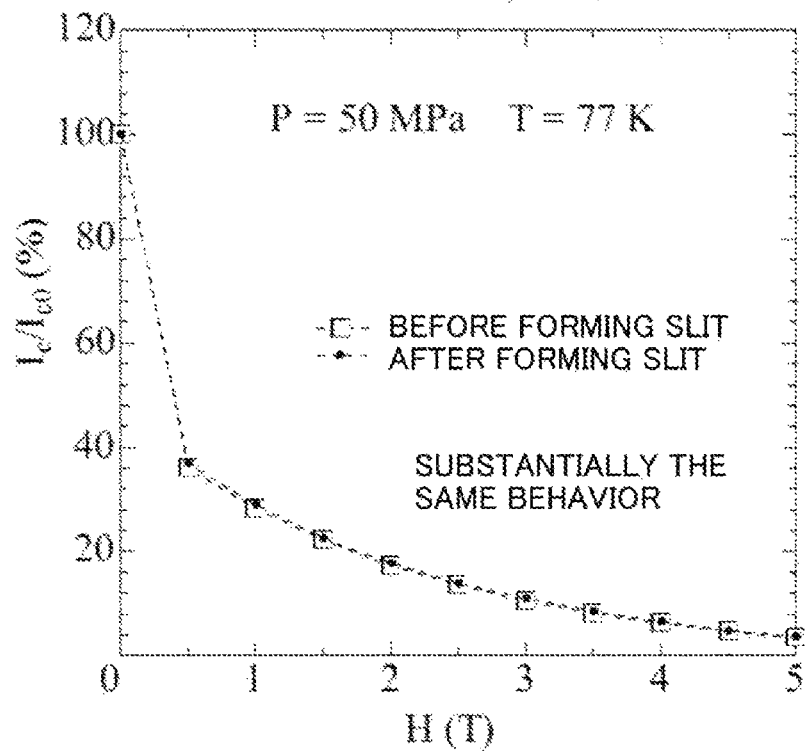

Then, the dependence of the critical current on the magnetic field under tension was measured. During the measurement, the REBCO multi-filamentary tape wire according to the embodiment was provided with a prescribed tension of 50 MPa in the lengthwise direction, and the critical current was measured while the externally applied magnetic field was varied. The result is given in FIG. 8(b). The abscissa in FIG. 8(b) represents the intensity of the externally applied magnetic field, and the ordinate represents the critical current (normalized with respect to critical current under no externally applied magnetic field). FIG. 8(b) also shows the result of the same procedure for the REBCO tape wire before being provided with the slit. As can be understood from the result, there was no degradation observed in the critical magnetic field while tension was applied in the presence of the slit and the wire withstood the high magnetic field.

Advantageous Effects of the Embodiment

The REBCO multi-filamentary tape wire according to the embodiment has the slit in the lengthwise direction for the REBCO layer and the intermediate layer, so that the diamagnetism of the tape surface can be reduced. Therefore, a screening current-induced magnetic field or AC loss in a superconducting coil of the REBCO multi-filamentary tape wire according to the embodiment can be reduced.

The width of the slit formed in the REBCO layer can be about as thin as 33 μm, so that degradation in the superconducting properties can be reduced. The reduction in the critical current can be reduced to about 1% as compared to the wire before being provided with the slit. Note that when the groove is formed by a conventional method such as mechanical grinding and chemical etching, the lower limit for the groove width is about 200 μm. Therefore, according to the embodiment, the slit width can be reduced to about ⅙ of the width obtained by the mechanical grinding or chemical etching.

In addition, in the REBCO multi-filamentary tape wire according to the embodiment, the metal substrate and the stabilizing layers are not provided with a slit and not fractured, and therefore high mechanical strength can be maintained, so that the use of the wire is not hindered by a high magnetic field.

The method for manufacturing the REBCO multi-filamentary tape wire described in connection with the embodiment allows simplified and high speed processing to be carried out, so that mass production is enabled. A multi-filamentary tape wire having a small groove width and sufficient mechanical strength may be produced by forming the groove by a laser but the manufacture involves lengthy time. According to the embodiment, a large quantity of long multi-filamentary tape wires can be produced for a short period of time.

First Modification of First Embodiment

According to the first embodiment, a slit is formed by partly bending the REBCO tape wire using the slit forming roller pair 23 including the roller slitter 23b and the guide roller 23a. However, the slit may be formed by locally concentrating stress rather than deforming the REBCO tape wire.

More specifically, in the slit forming device 20, the outer circumference of the guide roller 23a of the slit forming roller pair 23 may be made of a hard material such as cemented carbide and SUS instead of the soft material. The shape (width) of the edge and stress to be applied may be designed as appropriate so that the concentrated stress by the edge attains an appropriate value. As the REBCO tape wire is sandwiched between the guide roller and the roller slitter 23b, the stress concentrates at the part against which the edge of the roller slitter 23b is pressed, and the slit can be formed in the location of the REBCO layer.

Note that when the slit is formed by the stress concentration, it is preferable that a relatively thick REBCO tape wire is used. More specifically, a wire having a thickness of at least 0.2 mm is preferable, and the wire may be FYSC-SC05 manufactured by Fujikura Ltd.

Second Modification of First Embodiment

According to the first embodiment, a slit is formed by partly bending the REBCO tape wire using the slit forming roller pair 23 including the roller slitter 23b and the guide roller 23a. However, the slit may be formed by bending the REBCO tape wire into a V-shape by applying a load upon the entire width of the REBCO tape wire.

According to the modification, a slit forming roller pair 91 or 92 shown in FIG. 9(a) or FIG. 9(b) is used in place of the slit forming roller pair 23 in the slit forming device 20. FIGS. 9(a) and 9(b) are views of the slit forming roller pairs 91 and 92 according to the modification as viewed in the traveling direction of the tape wire.

The slit forming roller pair 91 shown in FIG. 9(a) includes a lower roller 91a and an upper roller 91b provided opposed to each other. The lower roller 91a is provided with a groove about as wide as the width of the tape wire (4 mm) at an outer circumference thereof, and the bottom surface of the groove is in a raised V-shape. The outer circumference of the upper roller 91b is in a recessed V-shape having about the same width to be fitted with the groove of the lower roller 91a. The lower roller 91a and the upper roller 91b have at least their outer circumferences made of a hard material such as cemented carbide and SUS.

In the slit forming roller pair 92 shown FIG. 9(b), the lower roller 92a has a recessed V-shaped bottom groove at an outer circumference thereof, and the upper roller 92b has an outer circumference in a raised V-shape. The other structure is the same as that of the slit forming roller pair 91 in FIG. 9(a).

The REBCO tape wire is passed between the slit forming roller pair 91 or 92, so that the tape wire can be bent into a V-shape, and the slit can be formed at the location of the bent (the vertex of the V-shape).

Second Embodiment

According to the first embodiment, the REBCO tape wire is provided with only the single slit. A REBCO multi-filamentary tape wire provided with a plurality of slits according to the present embodiment and a manufacturing method therefor will be described.

FIG. 10(a) is a view for illustrating slits provided in a REBCO multi-filamentary tape wire 10 according to the embodiment. A REBCO layer 13 and an intermediate layer 12 in the REBCO multi-filamentary tape wire 10 according to the embodiment have five slits 16-1 to 16-5 provided to equally divide the REBCO layer 13 and the intermediate layer 12 in the widthwise direction. These five slits divide the REBCO layer 13 and the intermediate layer 12 into six.

According to the embodiment, the slits are formed in the REBCO tape wire using a slit forming device 100 shown in FIG. 10(b). The slit forming device 100 has substantially the same structure as that of the slit forming device 20 according to the first embodiment but is different in that the device is provided with five slit forming roller pairs 23-1 to 23-5. The slit forming roller pairs 23-1 to 23-5 include guide rollers 23-1a to 23-5a and roller slitters 23-1b to 23-5b. The guide rollers 23-1a to 23-5a have the same structure. The roller slitters 23-1b to 23-5b have substantially the same structure but have edges arranged in different widthwise positions. FIG. 10(c) is a schematic view of the slit forming roller pairs 23-1 to 23-5 as viewed in the traveling direction of the tape wire for illustrating the positions of the edges of the roller slitters 23-1b to 23-5b. As shown in the figure, the positions of the edges are shifted in the widthwise direction of the tape wire, so that the slits are formed in different widthwise positions. The roller slitters 23-1b to 23-5b are connected with respective stress controllers, so that appropriate stress control is carried out for each of the roller slitters.

Note that in FIG. 10(c), the positions of the edges are shifted gradually from one end to the other, while the edges may be placed in a different appropriate order rather than being arranged orderly as shown. Alternatively, one roller slitter may have a plurality of edges, and one slit forming roller pair may form a plurality of slits at the same time.

In FIG. 10(b), the rollers are provided so that the tape wire traveling through the slit forming device 100 forms a circular arc shape or an elliptical arc shape. In this way, in each of the slit forming roller pairs, the area for providing the edge of the roller slitter and the tape wire may be reduced. However, in the location of each of the slit forming pairs, as far as the tape wire travels in a path raised to the side of the roller slitter, the shape does not have to be a circular arc shape or an elliptical arc shape.

The presence of the five slits divides the REBCO layer into six, and the filament width may be reduced to ⅙. The filament width may be reduced to ⅓ of that according to the first embodiment in which the layer is divided into two by forming the single slit. Therefore, the diamagnetism of the tape surface can be reduced. A superconducting coil made of such a REBCO multi-filamentary tape wire has a reduced screening current-induced magnetic field or AC loss. In addition, since the width of each slit is small, the superconducting properties are not degraded by forming the five slits or the reduction in the critical current is not much. The stabilizing layers are not cut, and therefore the mechanical strength is maintained.

In the illustrated example, the five slits are provided, but the number of slits may be less or more than five. It is preferable that a maximum number of slits are provided as far as the reduction in the critical current of the superconducting taper wire is within the allowable range.

Figure 11B:
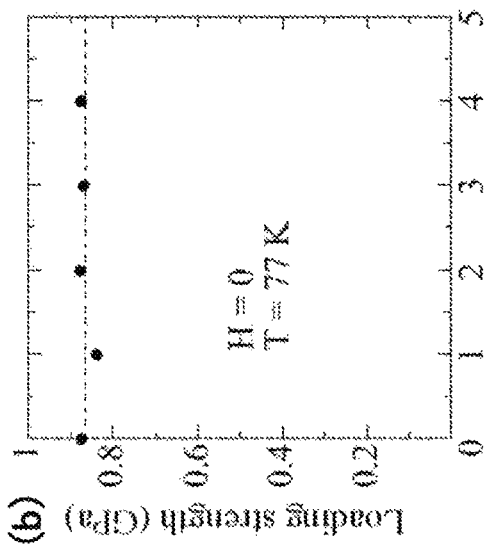
FIGS. 11(a) to 11(c) are graphs showing results of magnetization measurement, current-voltage characteristic measurement, and mechanical strength measurement for different numbers of slits.
Figure 11C:
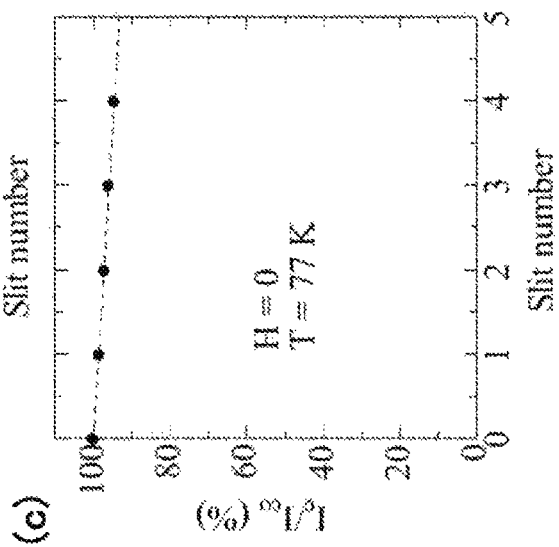
Figure 11A:
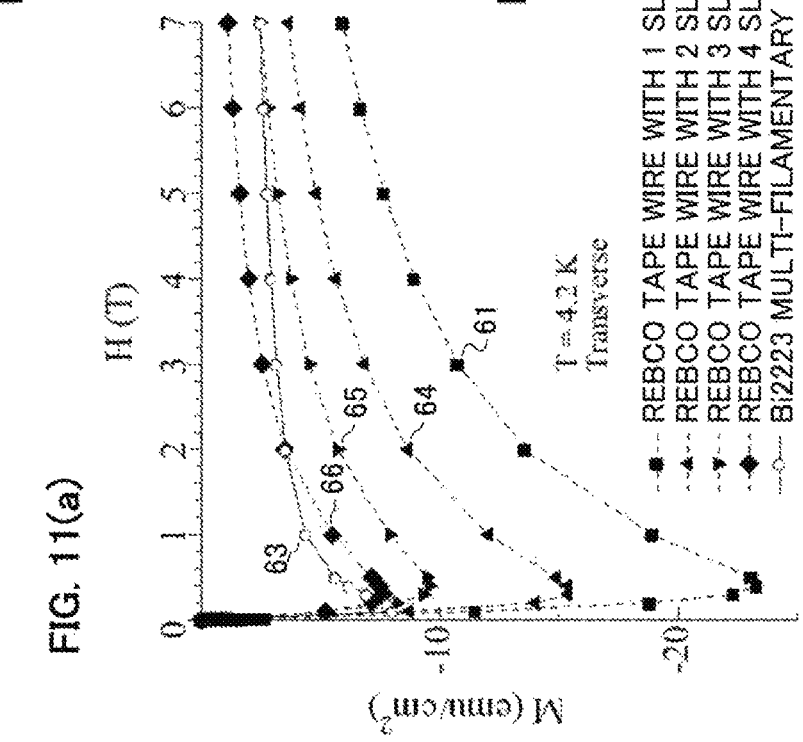

The results of magnetization measurement, current-voltage characteristic measurement, and mechanical strength measurement when the number of slits varied from one to four are given in FIGS. 11(a) to 11(c).

FIG. 11(a) shows the result of magnetization measurement in the same procedure as the first embodiment. In FIG. 11(a), the measurement results of the REBCO tape wires (REBCO multi-filamentary tape wires) provided with one to four slits are designated by 61, 64, 65, and 66, respectively. As examples for comparison, the measurement result 63 of a Bi2223 multi-filamentary wire are also shown. As the number of slits increases, the diamagnetism can be more reduced, and a screening current-induced magnetic field or AC loss in a superconducting coil can be further reduced.

FIG. 11(c) shows the result of measurement of current-voltage characteristic in the same procedure as the first embodiment, and critical current corresponding to the number of slits is shown (normalized with respect to the critical current without a slit). Note that similarly to the measurement according to the first embodiment (FIG. 7(b)), the critical current is defined as current with a potential difference of 1 μV/cm. The presence of a single slit reduces the critical current by about 1%, and as the number of slits increases, the critical current gradually decreases. However, even when four slit are formed, about 95% of the critical current without a slit can be maintained.

FIG. 11(b) shows the result of measurement of mechanical strength in the same procedure as the first embodiment, showing the tensile strength corresponding to the number of slits. Similarly to the first embodiment, the tensile strength is defined as stress corresponding to 90% of the critical current when there is no stress. As can be understood from the result, the tensile strength of the REBCO multi-filamentary tape wire hardly changes depending on the number of slits as the number of slit increases. More specifically, the presence of the four slit degrades the mechanical strength only by about 4% or less, and a very high mechanical strength as high as 800 MPa or more can be provided.

Note that the method for providing a slit by partly bending a tape wire by pressing the edge of a roller slitter has been described, while a slit may also be provided by any of the approaches of the stress concentration and bending the entire wire (the approaches according to the first and second modifications of the first embodiment). When the approach of the stress concentration is applied, the bottom part of the guide roller of the slit forming roller pair may be made of a hard material. When the approach of bending the entire wire is applied, using a plurality of slit forming roller pairs obtained by pressing as shown in FIG. 9, the positions of respective V-shaped tip end parts may be shifted in the widthwise direction.

Third Embodiment

According to the first embodiment, a REBCO tape wire is provided with a continuous slit in the lengthwise direction in a REBCO layer thereof. According to the present embodiment, a discontinuous slit (broken line shaped slit) in the lengthwise direction is provided.

Figure 12A:
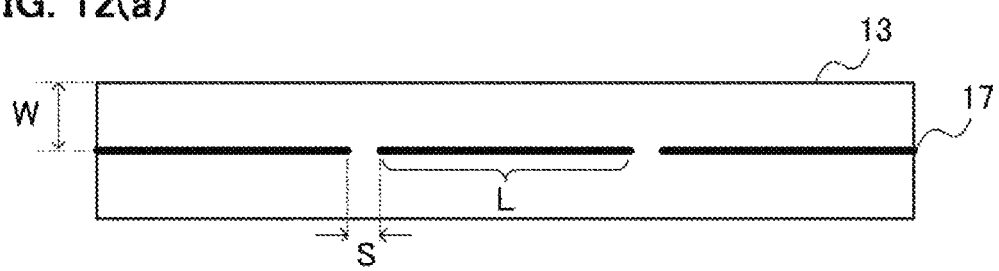
FIGS. 12(a) to 12(c) are schematic views for illustrating the configuration of a REBCO multi-filamentary tape wire and a manufacturing method therefor according to a third embodiment.

FIG. 12(a) is a view for illustrating a slit provided in a REBCO multi-filamentary tape wire 10 according to the embodiment. As shown in the figure, a REBCO layer 13 is provided with a discontinuous slit 17 having a length L with a gap S in the lengthwise direction. In this way, the part without a slit is provided, so that the region between the filaments of the long tape wire may have a shunt function, which improves the critical current through the tape wire. Note that coupling current of the wire passes through the part without a slit, the attenuation time for the coupling current (time constant) can be reduced, so that the coupling effect can be reduced significantly. In view of the critical current, the slit gap S is preferably larger than the filament width W and the difference is preferably as large as possible. However, when the gap S in the slit is excessively large, the effect of reducing the diamagnetism is lowered. Therefore, considering screening current or AC loss in a superconducting coil, the upper limit for the gap S is preferably about half of the inner diameter of a coil to be produced using the tape wire. The length L of a single slit segment is preferably greater than the diameter of the coil to be produced using the tape wire. If the length L of the slit segment is shorter than the diameter of the coil, a diamagnetic loop forms with respect to a magnetic field from a side, which lowers the performance with respect to screening current. As the length L of the slit segment is longer than the diameter of the coil, a screening current effect equivalent to the continuous slit may be provided.

Figure 12B:
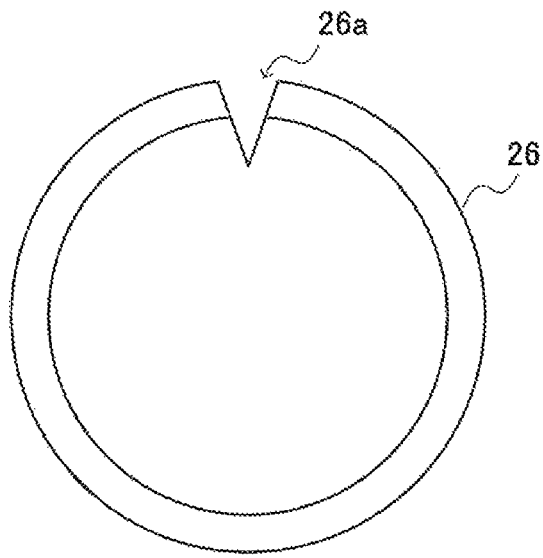
Figure 12C:
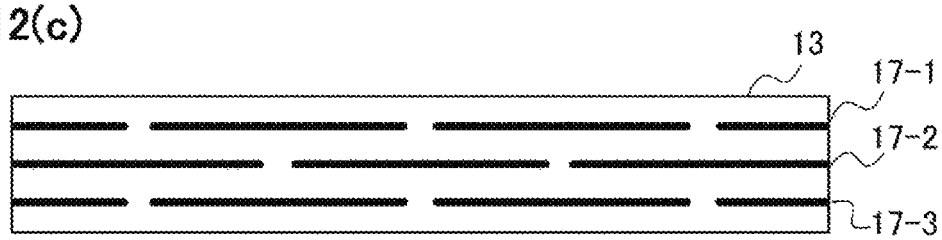

Now, with reference to FIG. 12(b), a method for manufacturing a REBCO multi-filamentary tape wire according to the embodiment will be described. FIG. 12(b) is a view for illustrating a roller slitter 26 when the REBCO multi-filamentary tape wire according to the embodiment is produced by the partial bending approach. The roller slitter 26 is not provided with an edge (edge member) at a part 26a of an outer circumference thereof. The roller slitter 26 may be applied in place of the roller slitter 23b of the slit forming device shown in FIG. 4. The tape wire is bent and provided with a slit by the edge of the roller slitter and the guide roller in the part provided with the edge, while the tape wire is not bent in the part not provided with the edge and a slit is not formed. Note however that discontinuous slit as shown in FIG. 12(c) may be formed by smaller stress on the edge than the necessary stress for forming a slit instead of not providing the edge at the part 26a of the outer circumference of the roller slitter 26, so that an incomplete slit is formed by the edge of the outer circumference 26. In this case, the slit length L and the slit gap S are sufficiently short but may still be as long as several µm to several hundred µm.

When the approach of bending the entire wire is applied, a notch part used to avoid contact with the outer circumference of the opposed roller may be provided at at least one of the upper roller and the lower roller of the slit forming roller pair shown in FIG. 9. In this arrangement, the tape wire is not bent and a slit is not provided at the notch part, so that a discontinuous slit may be formed. When a slit is formed by the stress concentration instead of bending the tape wire, the tape wire may be loaded using a roller slitter partly without an edge similarly to the above, so that a discontinuous slit may be formed. Note that the load applied on the roller may be set smaller than the stress necessary for forming a slit, so that a discontinuous slit may also be formed.

In FIG. 12(a), the REBCO multi-filamentary tape wire is provided with a single discontinuous slit line, while a plurality of discontinuous slits may be provided as shown in FIG. 12(c). In the latter case, it is preferable that the gaps between adjacent slits, where no slit is provided, are shifted so that the gaps do not overlap in the widthwise direction. In FIG. 12(c), the lengthwise positions of the gaps between the slits match the lengthwise centers of the slit forming parts of the slits adjacent to the gaps. The preferable conditions for the length L and gap S of the slits are the same as the above. More specifically, the gap S is preferably greater than the filament width W and not more than half of the inner diameter of a coil to be produced. The length L is preferably greater than the coil to be produced. In FIG. 12(c), the three slits are produced, while the number of slits may be more than three.

Other Embodiments

The configurations of the REBCO multi-filamentary tape wires may be modified in various manners. For example, in the above description, the REBCO tape wire is moved and a slit is formed by the slit forming roller pair of the slit forming device, while the REBCO tape wire may be fixed and the slit forming roller pair (or roller slitter) may be moved.

Instead of the REBCO tape wire having the stabilizing layers adapted to cover entirely around the metal substrate and the REBCO layer, a REBCO tape wire provided with stabilizing layers only on the REBCO layer may be used.

In the above description, the slit having a width of 33 µm is formed, but the slit may have a width equal to or greater than the above. The slit width is preferably as small as possible, while as far as the slit is provided at least only in the REBCO layer and the intermediate layer but not in the stabilizing layers, the diamagnetism may be reduced without degrading the mechanical strength. Note that considering that the lower limit for the width of a slit formed by mechanical grinding or chemical etching is about 200 µm, the slit width is preferably 200 µm or less, or more preferably less than that, i.e., 100 µm or less, even more preferably 50 µm or less, still more preferably 33 µm or less.

When a slit is formed in a wire by pressing an edge against the wire, the surface against which the edge is pressed may be on the side of the superconducting layer or the side of the substrate. More specifically, when the edge is pressed against the wire, the edge and the superconducting layer may be positioned on the same side as the substrate or on the opposite side to the substrate. A slit may be formed by bending the wire into a mountain fold or a valley fold. When a plurality of slits are formed, the edge may be pressed against different surfaces among the slits or the wire may be selectively bent into a mountain fold or a valley fold on a slit-basis.

When the wire is provided with a plurality of slits, respective slits may be formed by different slit forming approaches (the partial bending, the entire bending, and the stress concentration). When a single slit is formed, these method may be combined and carried out.

REFERENCE SIGNS LIST

10 REBCO multi-filamentary tape wire
11 Metal substrate

12 Intermediate layer
13 REBCO layer
14 Silver stabilizing layer
15 Copper stabilizing layer
16 Slit
20 Slit forming device
23 Slit forming roller pair
23a Guide roller
23b Roller slitter

The invention claimed is:

1. A method for manufacturing a high temperature multi-filamentary superconducting tape wire having an oxide superconducting layer formed on a tape-shaped metal substrate with an intermediate layer therebetween and a metal stabilizing layer formed on the oxide superconducting layer, the oxide superconducting layer and the intermediate layer being provided with one or more lengthwise slits, the metal substrate and the stabilizing layer being provided with no slit, the method comprising the steps of:

preparing a high temperature superconducting wire having the oxide superconducting layer formed on the tape-shaped metal substrate with the intermediate layer therebetween and the stabilizing layer formed on the oxide superconducting layer, and forming the one or more lengthwise slits either by bending the high temperature superconducting wire in a lengthwise direction thereof or concentrating stress on the high temperature superconducting wire in the lengthwise direction, or by carrying out both the bending and the stress concentration simultaneously.

2. The method for manufacturing a high temperature multi-filamentary superconducting tape wire of claim 1, wherein in the slit forming step, the slit is formed by pressing an edge member against the high temperature superconducting wire.

3. The method for manufacturing a high temperature multi-filamentary superconducting tape wire of claim 2, wherein the edge member is a rotating edge member, and wherein in the slit forming step, the slit is formed by passing the high temperature superconducting wire between the rotating edge member and a guide roller provided opposed to each other.

4. The method for manufacturing a high temperature multi-filamentary superconducting tape wire of claim 3, wherein the rotating edge member is not provided with an edge member at a part of a circumference thereof, and
in the slit forming step, the slit is formed discontinuously in a lengthwise direction of the high temperature superconducting wire.

5. The method for manufacturing a high temperature multi-filamentary superconducting tape wire of claim 1, wherein in the slit forming step, the slit is formed by bending the high temperature superconducting wire into a V-shape by embossing processing.

6. The method for manufacturing a high temperature multi-filamentary superconducting tape wire of claim 5, wherein in the slit forming step, the slit is formed by passing the high temperature superconducting wire between a first roller having an outer circumference in a raised V-shape and a second roller having an outer circumference in a recessed V-shape, the first and second rollers being provided opposed to each other.

7. The method for manufacturing a high temperature multi-filamentary superconducting tape wire of claim 6, wherein at least one of the first roller and the second roller is provided with a notch part at a part of the outer circumference thereof, and
in the slit forming step, the slit is formed discontinuously in the lengthwise direction of the high temperature superconducting wire.

* * * * *